US006975040B2

(12) United States Patent
Dower et al.

(10) Patent No.: US 6,975,040 B2
(45) Date of Patent: Dec. 13, 2005

(54) FABRICATING SEMICONDUCTOR CHIPS

(75) Inventors: Joseph P. Dower, Fogelsville, PA (US); Kultaransingh N. Hooghan, Allentown, PA (US)

(73) Assignee: Agere Systems Inc, Allentown, PA (US)

( * ) Notice: Subject to any disclaimer, the term of this patent is extended or adjusted under 35 U.S.C. 154(b) by 82 days.

(21) Appl. No.: 10/695,193

(22) Filed: Oct. 28, 2003

(65) Prior Publication Data
US 2005/0090071 A1 Apr. 28, 2005

(51) Int. Cl.[7] .................. H01L 23/544; H01L 21/70
(52) U.S. Cl. ................................. 257/797; 438/401
(58) Field of Search ............ 257/48, 797; 438/14–15, 438/106, 401, 462

(56) References Cited

U.S. PATENT DOCUMENTS

| 5,346,858 A | * | 9/1994 | Thomas et al. ............. 438/669 |
| 6,278,193 B1 | * | 8/2001 | Coico et al. ................ 257/797 |
| 6,392,300 B1 | * | 5/2002 | Koike ........................ 257/758 |
| 6,465,898 B1 | * | 10/2002 | Hnilo et al. ................ 257/797 |

FOREIGN PATENT DOCUMENTS

| JP | 1-241116 | * | 9/1989 | .......... H01L 21/30 |
| JP | 2001-7274 | * | 1/2001 | .......... H01L 23/12 |

* cited by examiner

Primary Examiner—Evan Pert

(57) ABSTRACT

A semiconductor chip and method of fabrication which permits precise location of hidden areas of the chip. At least two alignment marks are formed in or on the top passivation layer to provide topological features for location of the hidden areas. The hidden areas can then be selectively etched and/or added to, for example, by a focused ion beam for repair or other functions.

13 Claims, 3 Drawing Sheets

FABRICATING SEMICONDUCTOR CHIPS

FIELD OF THE INVENTION

The present invention relates generally to fabricating semiconductor chips, and, more particularly, to a method of preparing semiconductor chips for debugging and failure analysis.

BACKGROUND OF THE INVENTION

In the fabrication of semiconductor chips, an important step is selectively etching and/or adding metal to selected portions of the completed chip in order to debug problem areas. Typically, this involves using a focused ion beam (FIB) system in the desired areas in order to remove and/or add selected connector portions. The desired areas are usually identified by the FIB system using topological features for imaging contrast and navigation to the regions of interest. The FIB systems can then add or remove features depending on the gas applied.

In some devices, however, the entire chip is covered by one or more planarization layers, thereby hiding the topographical features which are used for aligning the focused ion beam. In some cases, the only features resolvable by the FIB system are the bonding pads. However, since the accuracy desired for FIB is generally in the range 0.1 to 0.2 microns, the pads cannot be used for alignment.

It is desirable, therefore, to provide a process permitting navigation of a focused ion beam on an otherwise planar Integrated Circuit (IC) chip.

SUMMARY OF THE INVENTION

To achieve these and other objects, and in view of its purposes, the present invention provides a method of fabricating a semiconductor chip which includes a passivation layer over the chip surface. At least two alignment marks are formed in or on the passivation layer. A focused ion beam can then be applied to a selected portion of the chip using the alignment marks to locate the selected area.

In accordance with another aspect, the invention is a semiconductor chip which includes a passivation layer as a top layer. At least two alignment marks are formed in or on the passivation layer to provide topological features for locating selected areas of the chip.

It is to be understood that both the foregoing general description and the following detailed description are exemplary, but are not restrictive, of the invention.

BRIEF DESCRIPTION OF THE DRAWING

The invention is best understood from the following detailed description when read in connection with the accompanying drawing. It is emphasized that, according to common practice in the semiconductor industry, the various features of the drawing are not to scale. On the contrary, the dimensions of the various features are arbitrarily expanded or reduced for clarity. Included in the drawing are the following figures.

DETAILED DESCRIPTION OF THE INVENTION

Figure 1:
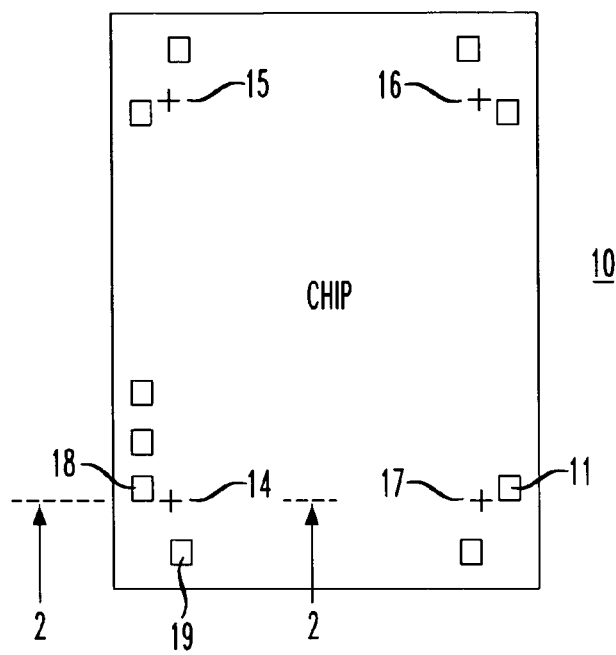
FIG. 1 is a plan view of a semiconductor chip including alignment marks according to an embodiment of the invention.
Figure 2:
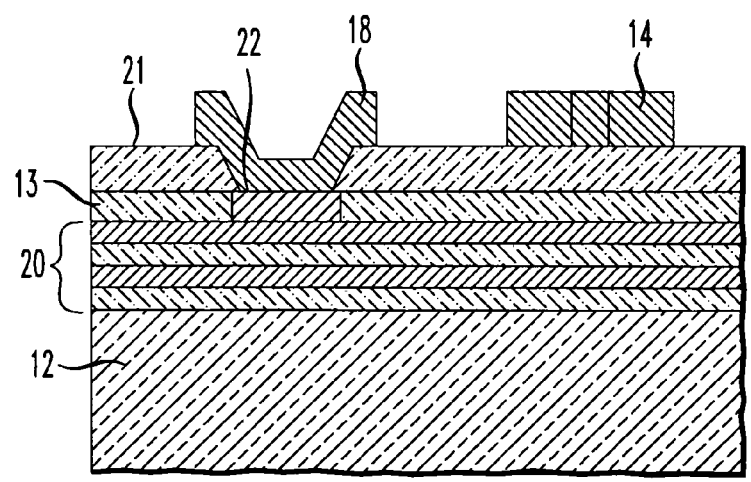
FIG. 2 is a cross sectional enlarged view of a portion of the chip of FIG. 1.

Referring now to the drawing, wherein like reference numerals refer to like elements throughout, FIG. 1 is a plan view of a typical semiconductor chip, 10, which includes features of the present invention in accordance with one embodiment, and FIG. 2 is a cross sectional enlarged view of a portion of that chip taken along line 2—2 of FIG. 1. The chip illustrated is essentially completed and includes bonding pads, e.g., 11, to which wire bonds (not shown) are bonded. The chip also includes the standard topological features such as alternate layers of dielectric and conductive layers, 20 of FIG. 2, formed over the semiconductor substrate, 12. These features are hidden in the final chip due to the formation of one or more planarization layers, 13 and 21, formed over essentially the entire surface of the chip. In this example, the substrate, 12, was silicon, and the planarization layers, 13 and 21, were polyimide and silicon nitride formed by standard techniques such as plasma enhanced chemical vapor deposition. The chip also includes metal areas, e.g., 22, on the surface through which bonding pads, e.g., 18, provide electrical contact to the underlying conductive layers.

Figure 3:
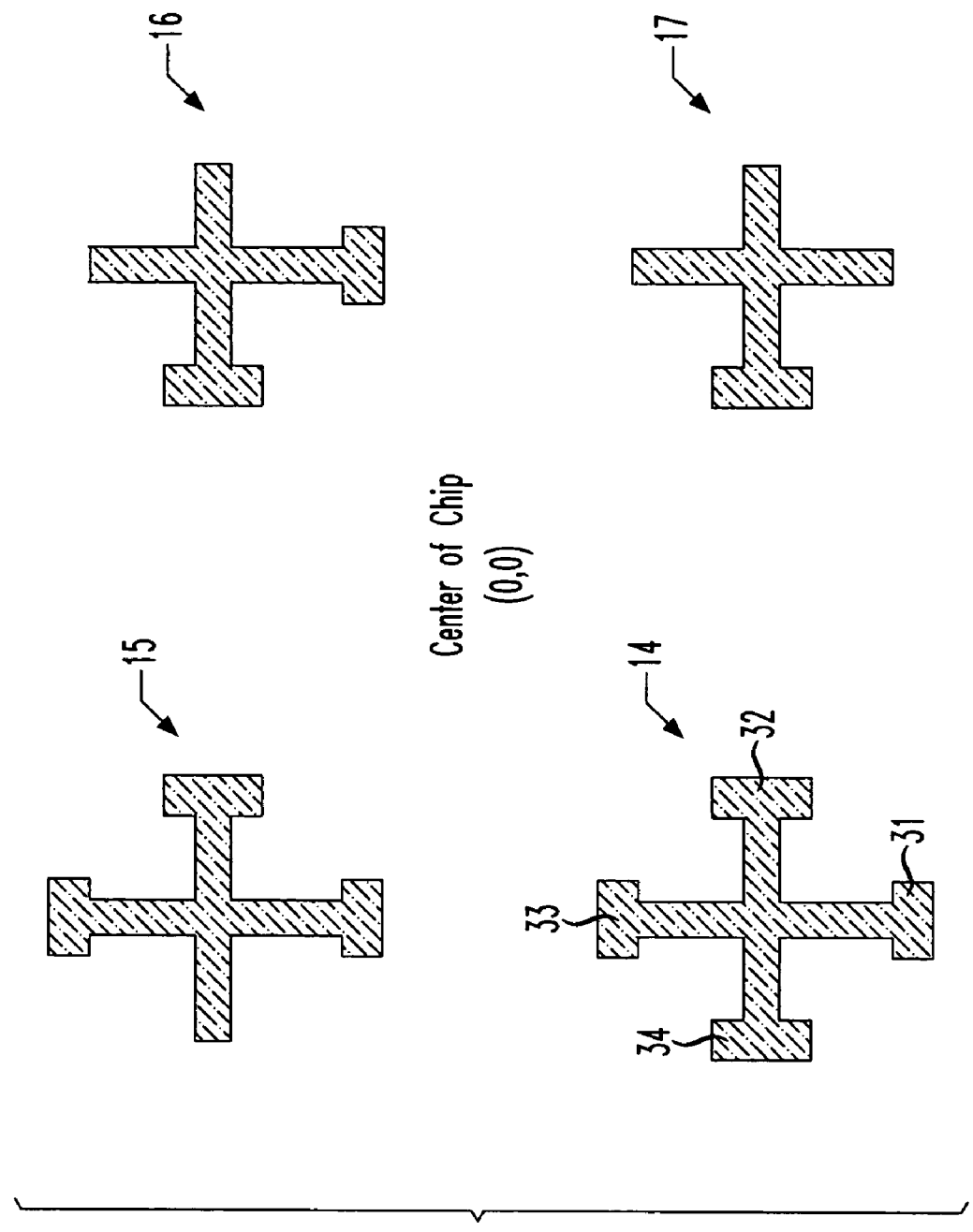
FIG. 3 is a plan view illustrating the shapes of the alignment marks which may be used according to one embodiment of the invention.

In order to provide alignment for the subsequent focused ion beam (FIB) etching and/or addition of metal portions, a plurality of alignment marks, 14–17 are formed on the top most planarization layer, 21. In this example, there are four marks, one each at one of the corners of the chip. However, other patterns are possible strewn all across the surface of the IC chip. As illustrated in FIG. 3, the marks are essentially in the shape of a cross, but can include rectangular portions, or "hammer heads" at one or more ends of the cross. For example, the alignment mark, 14, located at the lower left corner of the chip includes rectangular portions 31–34 at each end of the cross. Mark 15 includes three rectangular portions, mark 16 includes two portions, and mark 17 includes only one such portion. The purpose of these portions is to indicate in which quadrant of the chip the mark lies. Other patterns for the marks are possible.

Figure 4:
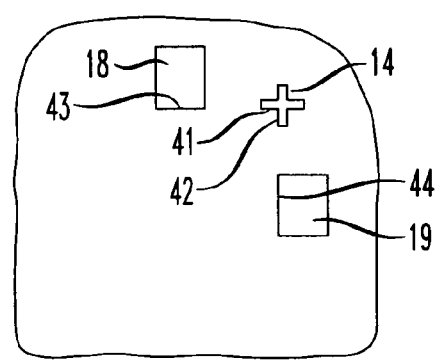
FIG. 4 is an enlarged plan view of a portion of the chip illustrated in FIG. 1.

As illustrated in the enlarged view of FIG. 4, the alignment marks, e.g., 14, can be formed so that one edge of each cross bar, e.g., 41 and 42, is aligned with an edge, 43 and 44, of a corresponding bonding pad, 18 and 19. This is done purely for the sake of convenience, and the marks can be formed anywhere on the passivation layer.

The marks in this example were formed by standard metal deposition techniques, e.g., sputter deposition, at the same time as the bond pads. The metal in this example was an aluminum copper alloy for both the pads and alignment marks. Again, this is for convenience, and the marks need not be formed at the same time or with the same material as the bonding pads.

Before the marks are formed on the chip, their position relative to the center of the chip was recorded in the computer aided design (CAD) database. After the marks were formed on the chip, the CAD layout was superimposed over an image of the chip surface generated by the FIB system using the marks in the database and on the chip for alignment. Once this superposition is achieved, any component can be located on the chip even though hidden by the passivation layer. Preferably, four marks are used for accuracy. However, two or three marks can also be used.

Figure 5:
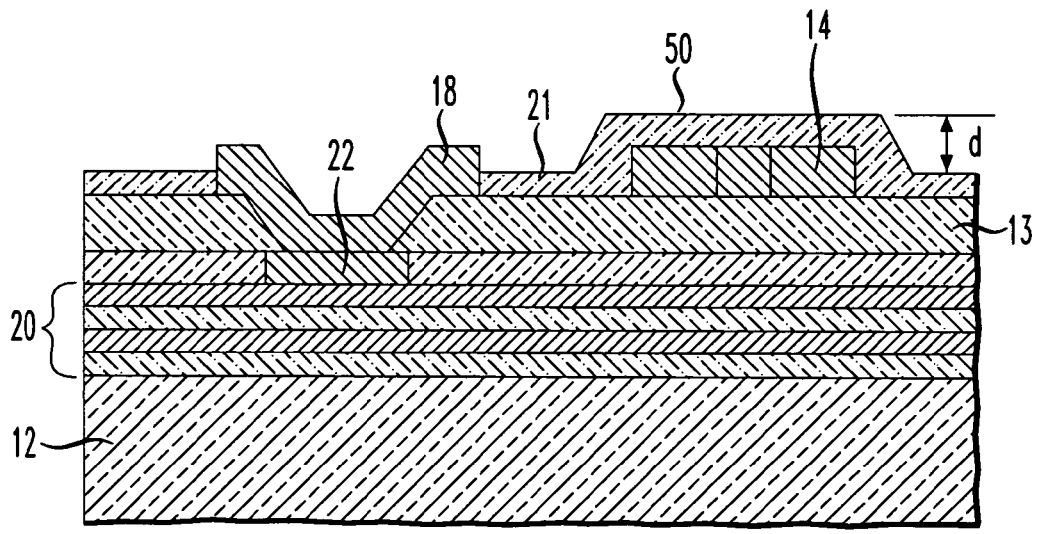
FIG. 5 is a cross sectional view of a portion of a chip in accordance with another embodiment of the invention.
Figure 6:
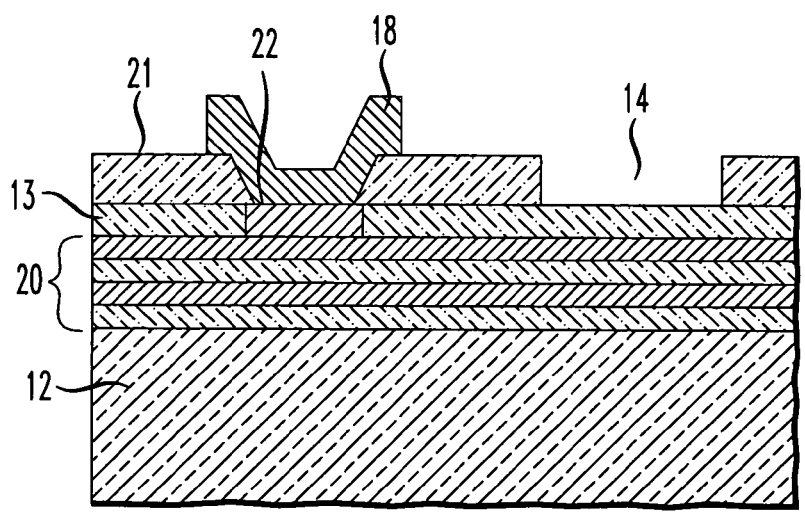
FIG. 6 is a cross sectional view of a portion of a chip in accordance with yet another embodiment of the invention

FIG. 5 illustrates a cross sectional view of a chip in accordance with another embodiment of the invention. This example is similar to the previously described embodiment except for the fact that the metal alignment marks, e.g., 14, are formed on the surface of the first passivation layer, 13, and the second passivation layer, 21 is then formed over the mark. If the passivation layer, 21, is sufficiently thin, typically one third to three quarters of the thickness of the metal alignment marks, the layer will form bumps, e.g., 50, which conform to the shape of the metal marks. Since the bumps have a height, d, above the surface of the top passivation layer, 21, topological features are formed which can be used in the subsequent FIB processing. Alternatively, as illustrated in FIG. 6, the metal marks, 14–17 could be eliminated entirely, and the topological features formed by etching any desired pattern into the top passivation layer.

Subsequent to the formation of the alignments marks, a standard focused ion beam apparatus was used to locate and etch away or add selected areas of the hidden conductors. The apparatus acted as a standard scanning electron microscope which located the selected areas using the height difference between the marks and the passivation layer as reference points.

Thus, in accordance with the invention and in the attached claims, it should be understood that the term "alignment mark" can include any topological feature formed in or on the top passivation layer which can be used by a scanning electron microscope and/or FIB system to locate components on the chip.

Although the invention has been described with reference to exemplary embodiments, it is not limited to those embodiments. For example, although the examples described above involved wire bonded chips, the invention could also be used in Flip-Chip bonded designs. Rather, the appended claims should be construed to include other variants and embodiments of the invention which may be made by those skilled in the art without departing from the true spirit and scope of the present invention.

What is claimed is:

1. A method of fabricating a semiconductor chip including a top passivation layer and an underlying passivation layer formed over the chip comprising the step of:

forming at least two alignment marks by depositing material over the underlying passivation layer, and then covering the material with the top passivation layer so that bumps are formed in the top passivation layer over the material, the bumps and material comprising the alignment marks.

2. The method according to claim 1 further comprising the step of selectively processing a portion of the chip using the marks to locate said portion, the processing selected from etching and adding material.

3. The method according to claim 2 wherein a focused ion beam is used to locate said portion.

4. The method according to claim 1 wherein the material comprises a metal.

5. The method according to claim 1 wherein the marks are in the shape of crosses.

6. The method according to claim 5 wherein the marks include rectangular portions at one or more ends of the crosses, the number of portions depending upon the quadrant of the chip in which the mark is positioned.

7. The method according to claim 1 wherein there are at least four alignment marks, one at each corner of the chip.

8. A semiconductor chip comprising:

a first passivation layer as a top layer;

a second passivation layer as an underlying layer; and at least two alignment marks comprising material deposited over the underlying passivation layer and covered by the top passivation layer so that bumps are formed in the top passivation layer over the material.

9. The chip according to claim 8 wherein the material comprises a metal.

10. The chip according to claim 8 wherein the marks are in the shape of crosses.

11. The chip according to claim 10 wherein the marks include rectangular portions at one or more ends of the crosses, the number of portions depending upon the quadrant of the chip in which the mark is positioned.

12. The chip according to claim 8 wherein there are at least four alignment marks, one at each corner of the chip.

13. The chip according to claim 8 wherein the alignment marks are adapted to permit location by a focused ion beam.

* * * * *